United States Patent
Jeong

(10) Patent No.: US 10,729,041 B2
(45) Date of Patent: Jul. 28, 2020

(54) LIQUID-COOLING TYPE DOUBLE-SIDED COOLER

(71) Applicants: HYUNDAI MOTOR COMPANY, Seoul (KR); KIA MOTORS CORPORATION, Seoul (KR)

(72) Inventor: Sang Chan Jeong, Seoul (KR)

(73) Assignees: Hyundai Motor Company, Seoul (KR); KIA Motors Corporation, Seoul (KR)

( * ) Notice: Subject to any disclaimer, the term of this patent is extended or adjusted under 35 U.S.C. 154(b) by 264 days.

(21) Appl. No.: 15/833,408

(22) Filed: Dec. 6, 2017

(65) Prior Publication Data
US 2019/0090388 A1    Mar. 21, 2019

(30) Foreign Application Priority Data
Sep. 18, 2017  (KR) ........................ 10-2017-0119338

(51) Int. Cl.
*H05K 7/20* (2006.01)
*F25B 31/00* (2006.01)
(Continued)

(52) U.S. Cl.
CPC ....... *H05K 7/20927* (2013.01); *F25B 31/008* (2013.01); *F28D 1/0325* (2013.01);
(Continued)

(58) Field of Classification Search
CPC . H05K 7/20927; F28D 1/0325; F28D 1/0333; F28F 1/24; F28F 3/025; H01L 23/473; H01L 23/3672
(Continued)

(56) References Cited

U.S. PATENT DOCUMENTS 6,131,648 A * 10/2000 Rasmussen ............. F28F 3/042
165/145
7,189,468 B2 * 3/2007 Izenson ............... H01M 8/0206
429/444
(Continued)

FOREIGN PATENT DOCUMENTS

KR    10-2010-0102831    9/2010
KR      1020170079191    7/2017

OTHER PUBLICATIONS

Korean Office Action for KR10-2017-0119338 dated Mar. 14, 2019 (5 pgs).

*Primary Examiner* — Joel M Attey
(74) *Attorney, Agent, or Firm* — Brinks Gilson & Lione

(57) ABSTRACT

The present disclosure provides a liquid-cooling type double-sided cooler, including a first cooling portion and a second cooling portion. In the liquid-cooling type double-sided cooler, another end of the first cooling portion is formed with a first communication hole that is configured to penetrate the first cooling liquid path and an outside of the first cooling portion, another end of the second cooling portion is formed with a second communication hole that is configured to penetrate the second cooling liquid path and an outside of the second cooling portion; and the first cooling portion and the second cooling portion are positioned such that the first communication hole and the second communication hole face each other, and the first cooling liquid path and the second cooling liquid path are connected with each other.

13 Claims, 13 Drawing Sheets

(51) Int. Cl.
  *F28D 1/03*   (2006.01)
  *F28F 1/24*   (2006.01)
  *H01L 23/473*  (2006.01)
  *F28F 3/02*   (2006.01)
  *F28D 21/00*  (2006.01)
  *F28F 9/26*   (2006.01)
  *H01L 23/367*  (2006.01)

(52) U.S. Cl.
  CPC .............. *F28D 1/0333* (2013.01); *F28F 1/24* (2013.01); *F28F 3/025* (2013.01); *H01L 23/473* (2013.01); *F28D 2021/0029* (2013.01); *F28F 9/264* (2013.01); *F28F 2230/00* (2013.01); *H01L 23/3672* (2013.01)

(58) Field of Classification Search
  USPC .......................................... 165/80.4, 104.33
  See application file for complete search history.

(56) References Cited

U.S. PATENT DOCUMENTS

| | | | |
|---|---|---|---|
| 7,568,520 B2* | 8/2009 | Ozawa | F28D 9/0043 |
| | | | 138/89 |
| 8,895,173 B2 | 11/2014 | Gandhi et al. | |
| 9,293,680 B2 | 3/2016 | Poliquin et al. | |
| 2006/0278378 A1* | 12/2006 | Okura | F28D 9/0043 |
| | | | 165/140 |
| 2015/0292803 A1* | 10/2015 | Nyander | F28F 3/10 |
| | | | 165/166 |

\* cited by examiner

LIQUID-COOLING TYPE DOUBLE-SIDED COOLER

CROSS REFERENCE TO RELATED APPLICATION

The present application claims priority to and the benefit of Korean Patent Application No. 10-2017-0119338, filed on Sep. 18, 2017, which is incorporated herein by reference in its entirety.

FIELD

The present disclosure relates to a liquid-cooling type double-sided cooler, and more particularly, to a liquid-cooling type double-sided cooler capable of improving a temperature deviation of cooling liquid flowing therein, reducing a pressure loss of cooling liquid, and resolving reduction of cooling performance and a pressure deviation of cooling liquid.

BACKGROUND

The statements in this section merely provide background information related to the present disclosure and may not constitute prior art.

A power conversion device (for example, an inverter) which is one of core components of a hybrid vehicle and an electric vehicle has been developed as a main component of an eco-friendly vehicle. The development of a power module which is another core component of the power conversion device usually takes the very high cost in the field of the eco-friendly vehicle.

A point of a main core technology development of the power module relates to cost savings and enhancement of cooling performance. When the cooling performance of the power module is enhanced, it may be possible to reduce a rated current of a power semiconductor element and to reduce a chip size at the same time, thereby implementing price savings of a chip and a stable operation of the power module.

For enhancing cooling performance of the power module, a liquid-cooling type double-sided cooler, which contacts cooling portions within which cooling liquid flows with upper and lower surfaces of the power module, respectively, is currently used.

In the related art, a liquid-cooling type double-sided cooler adopts a method that forms upper and lower cooling portions. This method makes a cooling tube through an extrusion process and then through a bending process, which enables to contact with upper and lower surfaces of the power module.

Since the liquid-cooling type double-sided cooler in the related art has the same formation of flow paths in a cooling period (contacting with the power module) and in a non-cooling period (not contacting with the power module), cooling efficiency in the cooling period is limited and an unnecessary pressure loss in the non-cooling period, particularly, in the bending process may occur.

Further, in the case that the liquid-cooling type double-sided cooler increases the number of a cooling pin therein so as to enhance cooling efficiency, a size of a flow path may be reduced; and in the bending process, the possibility of narrowing or blocking the flow path may be increased. As a result, a pressure loss is increased, the burden on a cooling liquid pump is also increased, and a risk of blocking the flow path due to impurities is also increased. Further, in the bending process and the following assembly process, the possibility of breaking the cooling tube may be increased as well.

Further, in the related art, cooling efficiency may be reduced due to the difference of the cooling liquid temperature between the divided flow paths as a flow path is evenly divided within the tube.

The foregoing is intended merely to aid in the understanding of the background of the present disclosure, and is not intended to mean that the present disclosure falls within the purview of the related art that is already known to those skilled in the art.

SUMMARY

The present disclosure is intended to provide a liquid-cooling type double-sided cooler capable of improving a temperature deviation of cooling liquid flowing therein, reducing a pressure loss of cooling liquid, and resolving reduction of cooling performance and a pressure deviation of cooling liquid. The present disclosure provides a liquid-cooling type double-sided cooler including: a first cooling portion configured to form a first cooling liquid path within which cooling liquid flows and to flow and discharge the cooling liquid into one end of the first cooling portion;

a second cooling portion configured to form a second cooling liquid path within which the cooling liquid flows and to flow and discharge the cooling liquid into one end of the second cooling portion, and to locate at a predetermined distance from the first cooling portion toward a lower portion of the first cooling portion;

another end of the first cooling portion is formed with a first communication hole that is configured to penetrate the first cooling liquid path and an outside of the first cooling portion; and another end of the second cooling portion is formed with a second communication hole that is configured to penetrate the second cooling liquid path and an outside of the second cooling portion; and the first cooling portion and the second cooling portion are positioned such that the first communication hole and the second communication hole face each other and the first cooling liquid path and the second cooling liquid path are connected with each other.

In one form of the present disclosure, the first cooling portion may include a first edge portion that protrudes toward the outside of the first cooling portion along a circumference of the first communication hole; the second cooling portion may include a second edge portion that protrudes toward the outside of the second cooling portion along a circumference of the second communication hole; and the first edge portion and the second edge portion may be coupled to each other, and the first cooling liquid path and the second cooling liquid path may be connected with each other.

One form of the present disclosure may further include a sealing portion configured to seal a space between the first edge portion and the second edge portion, wherein the sealing portion is positioned between the first edge portion and the second edge portion.

In one form of the present disclosure, the second edge portion may include: a first protrusion portion protruding toward an outside of the second communication hole along the circumference of the second communication hole and a second protrusion portion protruding toward an outside of the first protrusion portion along a circumference of the first protrusion portion, wherein the second protrusion portion is provided in an opposite direction of the second communication hole from the first protrusion portion; and the first edge portion may be inserted into a space between the first protrusion portion and the second protrusion portion such that the first edge portion and the second edge portion may be coupled to each other.

One form of the present disclosure may further include a sealing portion formed in a space between the first protrusion portion and the second protrusion portion and configured to seal the space between the first protrusion portion and the second protrusion portion.

In one form of the present disclosure, the first cooling portion may include a first edge portion having a predetermined thickness on a circumference of the first communication hole; the second cooling portion may include a second edge portion having a predetermined thickness on a circumference of the second communication hole; and one surface of the first edge portion and one surface of the second edge portion may contact with each other such that the first cooling liquid path and the second cooling liquid path may be connected with each other.

In one form of the present disclosure, the one surface of the second edge portion may include a sealing portion filled with a groove that is formed along the circumference of the second communication hole.

In one form of the present disclosure, the first edge portion may include a protrusion portion that protrudes along the circumference of the first communication hole on one surface thereof; the second edge portion may include a groove formed along the circumference of the second communication hole on one surface thereof; and when the one surface of the first edge portion and the one surface of the second edge portion contact with each other, the protrusion portion may be inserted into the groove.

One form of the present disclosure may further include a sealing portion configured to seal a space between the protrusion portion and the groove.

In one form of the present disclosure, the first edge portion may include a first groove formed along the circumference of the first communication hole on the other surface thereof; and the second edge portion may include a second groove formed along the circumference of the second communication hole on the other surface thereof, wherein the first groove and the second groove face each other. The form, when one surface of the first cooling portion and one surface of the second cooling portion contact with each other, may further include a sealing portion configured to fill in a space formed by the first groove and the second groove together.

In one form of the present disclosure, the first cooling portion may include an upper cover coupled to a lower cover, and the lower cover on which the first communication hole is formed, wherein the upper cover and the lower cover are configured to form the first cooling liquid path.

In one form of the present disclosure, the second cooling portion may include an upper cover on which the second communication hole is formed and a lower cover coupled to the upper cover, wherein the upper cover and the lower cover are configured to form the second cooling liquid path.

In one form of the present disclosure, the first cooling portion may include a cooling pin that is positioned on the first cooling liquid path.

In one form of the present disclosure, the second cooling portion may include a cooling pin that is positioned on the second cooling liquid path.

In one form of the present disclosure, the cooling pin may be positioned at a location facing a cooling object that is provided between the first cooling portion and the second cooling portion.

As another means for achieving the object, the present disclosure provides a liquid-cooling type double-sided cooler including: a first cooling portion including a first upper cover coupled to a first lower cover and the first lower cover having a first communication hole that is configured to penetrate the first cooling liquid path and an outside of the first cooling portion on one end portion of the first lower cover, wherein the first upper cover and the first lower cover form a first cooling liquid path between the first upper cover and the first lower cover; and a second cooling portion including a second lower cover coupled to a second upper cover and the second upper cover having a second communication hole that is configured to penetrate the second cooling liquid path and an outside of the second cooling portion on one end portion of the second upper cover, wherein the second upper cover is provided at a predetermined distance from a lower portion of the first cooling portion; and the first cooling portion and the second cooling portion are positioned such that the first communication hole and the second communication hole face each other; and thereby the first cooling liquid path and the second cooling liquid path are connected with each other.

In one form of the present disclosure, the first cooling portion may include a first edge portion that is attached to the first lower cover and protrudes toward a lower portion thereof along a circumference of the first communication hole; the second cooling portion may include a second edge portion that is attached to the second upper cover and protrudes toward an upper portion thereof along a circumference of the second communication hole; and the first edge portion and the second edge portion may be coupled to each other such that the first cooling liquid path and the second cooling liquid path may be connected with each other.

One form of the present disclosure may further include a sealing portion provided between the first edge portion and the second edge portion and configured to seal a space between the first edge portion and the second edge portion.

In one form of the present disclosure, the second edge portion may include a first protrusion portion protruding toward an outside of the second communication hole along the circumference of the second communication hole and a second protrusion portion protruding toward an outside of the first protrusion portion along a circumference of the first protrusion, wherein the second protrusion portion is provided in an opposite direction of the second communication hole from the first protrusion portion; and the first edge portion may be inserted into a space between the first protrusion portion and the second protrusion portion such that the first edge portion and the second edge portion may be coupled to each other.

One form of the present disclosure may further include a sealing portion formed in the space between the first protrusion portion and the second protrusion portion and configured to seal a space between the first protrusion portion and the second protrusion portion.

In one form of the present disclosure, the first cooling portion may include a first edge portion attached to the first lower cover and having a predetermined thickness on the circumference of the first communication hole; the second cooling portion may include a second edge portion attached to the second upper cover and having a predetermined thickness on the circumference of the second communication hole; and a lower surface of the first edge portion and an upper surface of the second edge portion may contact with each other and may be coupled such that the first cooling liquid path and the second cooling liquid path may be connected with each other.

In one form of the present disclosure, the upper surface of the second edge portion may include a groove formed along the circumference of the second communication hole. The form may further include a sealing portion filled in the groove.

In one form of the present disclosure, the first edge portion may include a protrusion portion that protrudes along the circumference of the first communication hole on a lower surface thereof; the second edge portion may include a groove that is formed along the circumference of the second communication hole on an upper surface thereof; and when the lower surface of the first edge portion and the upper surface of the second edge portion contact with each other, the protrusion portion may be inserted into the groove.

One form of the present disclosure may further include a sealing portion configured to seal a space between the protrusion portion and the groove.

In one form of the present disclosure, the first edge portion may include a first groove formed along the circumference of the first communication hole on a lower surface thereof; and the second edge portion may include a second groove formed along the circumference of the second communication hole on an upper surface thereof and configured to face the first groove. The form, when the lower surface of the first cooling portion and the upper surface of the second cooling portion contact with each other, may further include a sealing portion configured to fill in a space formed by the first groove and the second groove together.

In one form of the present disclosure, the second upper cover may further include a guide portion extended along the circumference of the second communication hole and protruded toward an upper portion thereof; the second edge portion may be provided at a predetermined distance from the guide portion; and an upper end of the guide portion and the upper surface of the second edge portion may contact with the lower surface of the first edge portion. The form may further include a sealing portion configured to fill in a space between the guide portion and the second edge portion.

In one form of the present disclosure, the first lower cover may further include a first guide portion extended along the circumference of the first communication hole and protruded toward a lower portion thereof; the second upper cover may further include a second guide portion extended along the circumference of the second communication hole and protruded toward an upper portion thereof; the first edge portion may be provided at a predetermined distance from the first guide portion; the second edge portion may be provided at a predetermined distance from the second guide portion; a lower end of the first guide portion and an upper end of the second guide portion may contact with each other; and a first space between the first edge portion and the first guide portion and a second space between the second edge portion and the second guide portion may face each other. The form may further include a sealing portion configured to fill in a space formed by the first space and the second space together.

In one form of the present disclosure, the first lower cover may further include a first guide portion extended along the circumference of the first communication hole and protruded toward a lower portion thereof; the second upper cover may further include a second guide portion extended along the circumference of the second communication hole and protruded toward an upper portion thereof; the first cooling portion may include a first protection plate that is attached to the first lower cover and is provided on the circumference of the first communication hole; the second cooling portion may include a second protection plate that is attached to the second upper cover and is provided on the circumference of the second communication hole, and having a protrusion portion protruded toward an upper portion thereof along the circumference of the second communication hole at a location spaced at a predetermined distance from the second communication hole; and a lower end of the first guide portion and an upper end of the second guide portion may contact with each other and may be coupled such that the first cooling liquid path and the second cooling liquid path may be connected with each other. The form may further include a gasket provided between a lower surface of the first protection plate and an upper surface of the second protection plate, wherein the second protection plate is provided between the protrusion portion and the second guide portion.

In one form of the present disclosure, the first protection plate may include a protrusion portion protruded toward a lower portion thereof along the circumference of the first communication hole located at a predetermined distance from the first communication hole; a lower end of the protrusion portion of the first protection plate and an upper end of the protrusion portion of the second plate may contact with each other; and the gasket may be provided in a space formed by a third space and a fourth space, wherein the third space is a space between the protrusion portion of the first protection plate and the first guide portion and the fourth space is a space between the protrusion portion of the second protection plate and the second guide portion.

In some forms of the liquid-cooling type double-sided cooler, it may be possible to position the cooling pin only on a portion required by cooling, thereby implementing an intensive cooling on the cooling object and reducing a pressure loss of cooling liquid by the cooling pin; and to divide the flow path within which cooling liquid flows by the cooling pin, thereby preventing occurrence of a temperature deviation of cooling liquid. Accordingly, it may be possible to enhance cooling efficiency.

Further, in some forms of the liquid-cooling type double-sided cooler, it may be possible to form a separate coupling structure so that the upper and lower cooling portions are connected with each other through the communication hole formed on each of the lower surface and the upper surface thereof, when comparing with the liquid-cooling type double-sided cooler in the related art that forms the cooling structure of the upper and lower portions through the bending process with respect to a tube-shaped cooling portion, thereby resolving issues such as narrowing of the flow path and a pressure loss, blockage of the flow path due to impurities that may occur in the bending process. Additionally, an issue that the cooler may be easily broken in the bending process or after the bending process may also be resolved.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
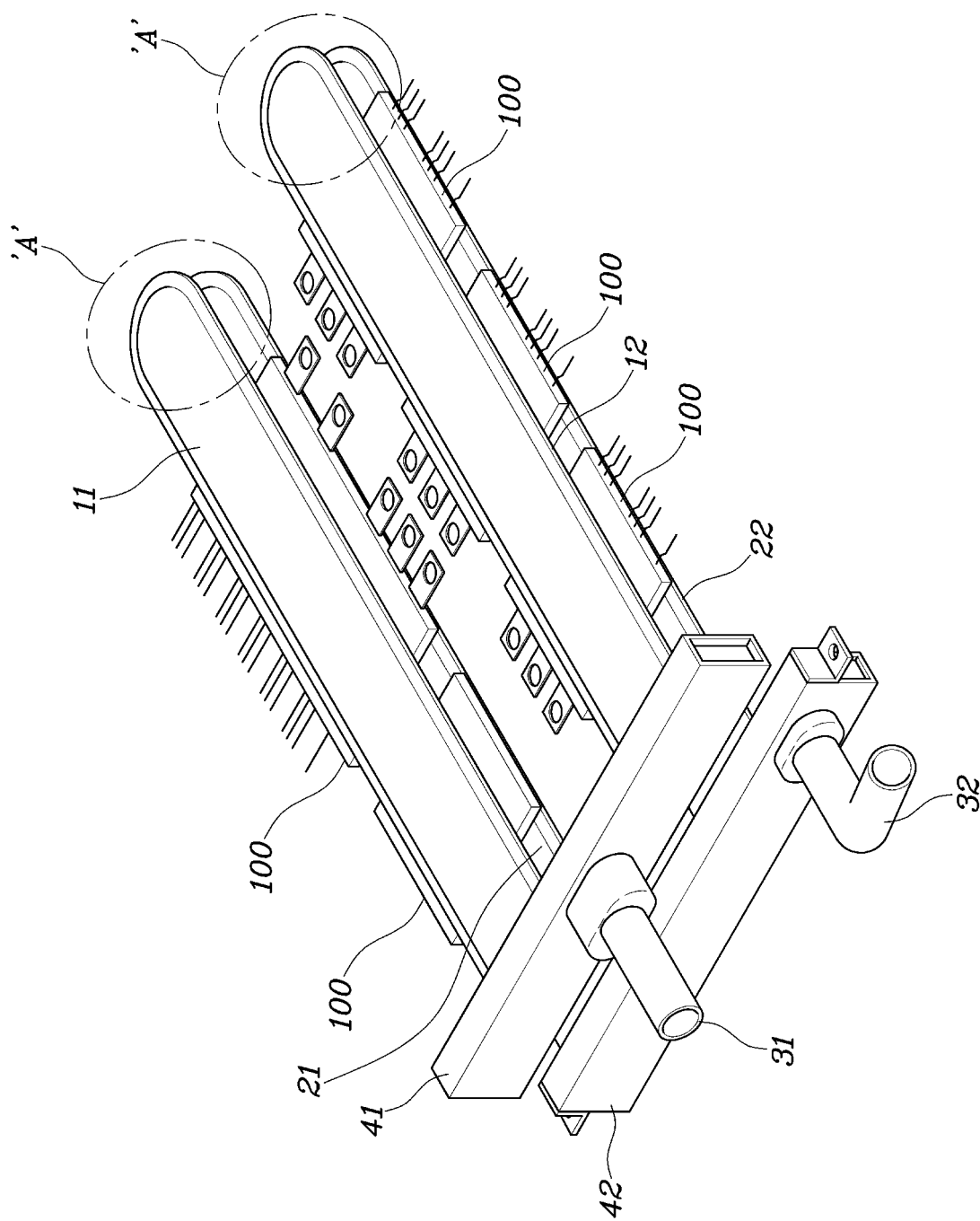
FIG. 1 is a perspective view illustrating a liquid-cooling type double-sided cooler.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Hereinafter, a liquid-cooling type double-sided cooler in various forms of the present disclosure will be described in more detail with reference to the accompanying drawings.

Figure 2:
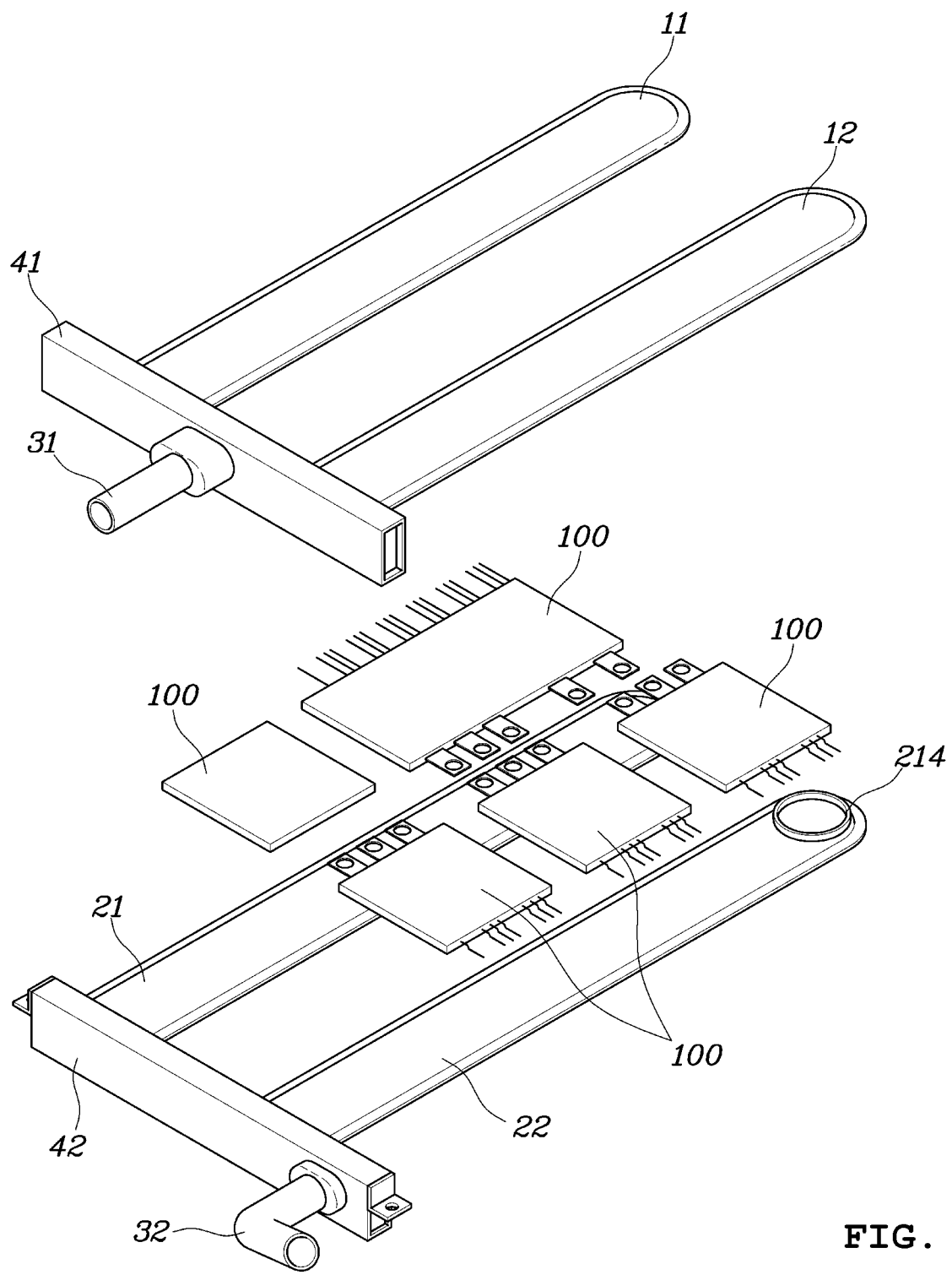
FIG. 2 is an exploded perspective view illustrating the liquid-cooling type double-sided cooler illustrated in FIG. 1.

FIG. 1 is a perspective view illustrating a liquid-cooling type double-sided cooler in one form of the present disclosure; FIG. 2 is an exploded perspective view illustrating the liquid-cooling type double-sided cooler in one form of the present disclosure illustrated in FIG. 1; and FIG. 3 is a side view illustrating the liquid-cooling type double-sided cooler in one form of the present disclosure illustrated in FIG. 1.

Figure 3:
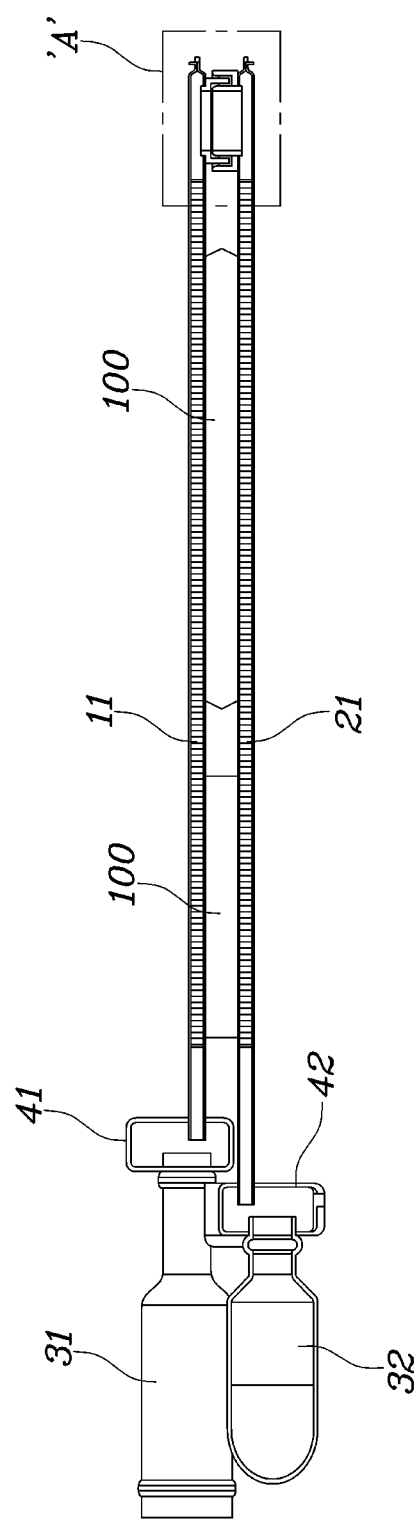
FIG. 3 is a side view illustrating the liquid-cooling type double-sided cooler illustrated in FIG. 1.

Referring to FIGS. 1 to 3, a liquid-cooling type double-sided cooler in one form of the present disclosure may be configured to include a first cooling portion 11, 12 and a second cooling portion 21, 22.

The first cooling portion 11, 12 has a structure that a cooling liquid path within which cooling liquid flows may be formed and that cooling liquid may be introduced and discharged into one end thereof. Likewise, the second cooling portion 21, 22 also has a structure that a cooling liquid path within which cooling liquid flows may be formed and that cooling liquid may be introduced and discharged into one end thereof.

The first cooling portion 11, 12 and the second cooling portion 21, 22 may be positioned to be spaced at a predetermined interval with an upper-lower relationship and a cooling object 100 may be interposed in a space therebetween. For example, the cooling object 100 may become a power module for power conversion that packages an element such as an Insulated Gate Bipolar Transistor (IGBT) or a diode and the like. An upper surface of the cooling object 100 may directly contact with a lower surface of the first cooling portion 11, 12 or contact with the first cooling portion 11, 12 while interposing a thermal grease therebetween; and a lower surface of the cooling object 100 may directly contact with an upper surface of the second cooling portion 21, 22 or contact with the second cooling portion 21, 22 while interposing a thermal grease therebetween.

According to the arrangements, it is possible to perform a thermal exchange on contacting surfaces of the cooling object 100 and the cooling portions 11, 12, 21, 22, thereby preventing over-temperature of the cooling object 100 and implementing the cooling.

Figure 4:
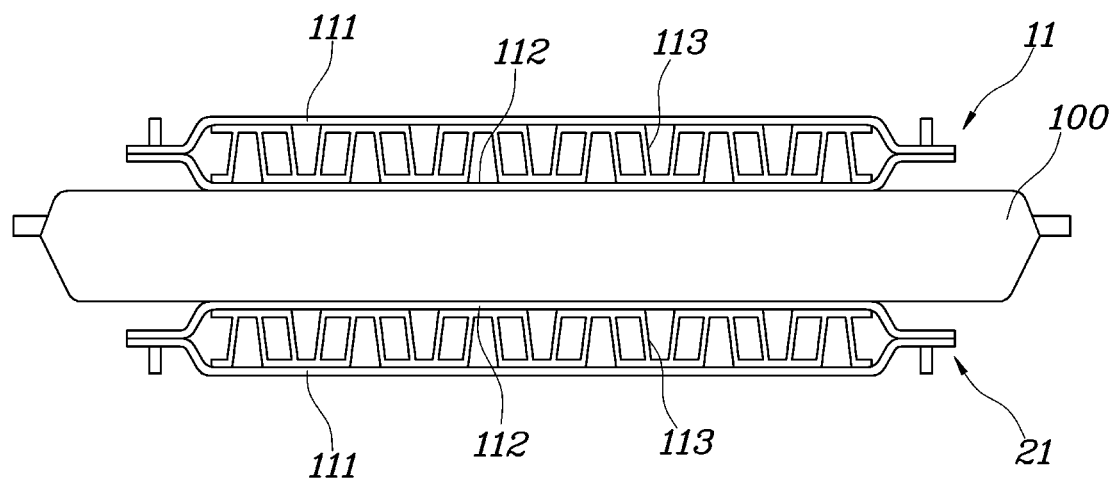
FIG. 4 is a cross-sectional view partially taken on the liquid-cooling type double-sided cooler illustrated in FIG. 1.
Figure 5:
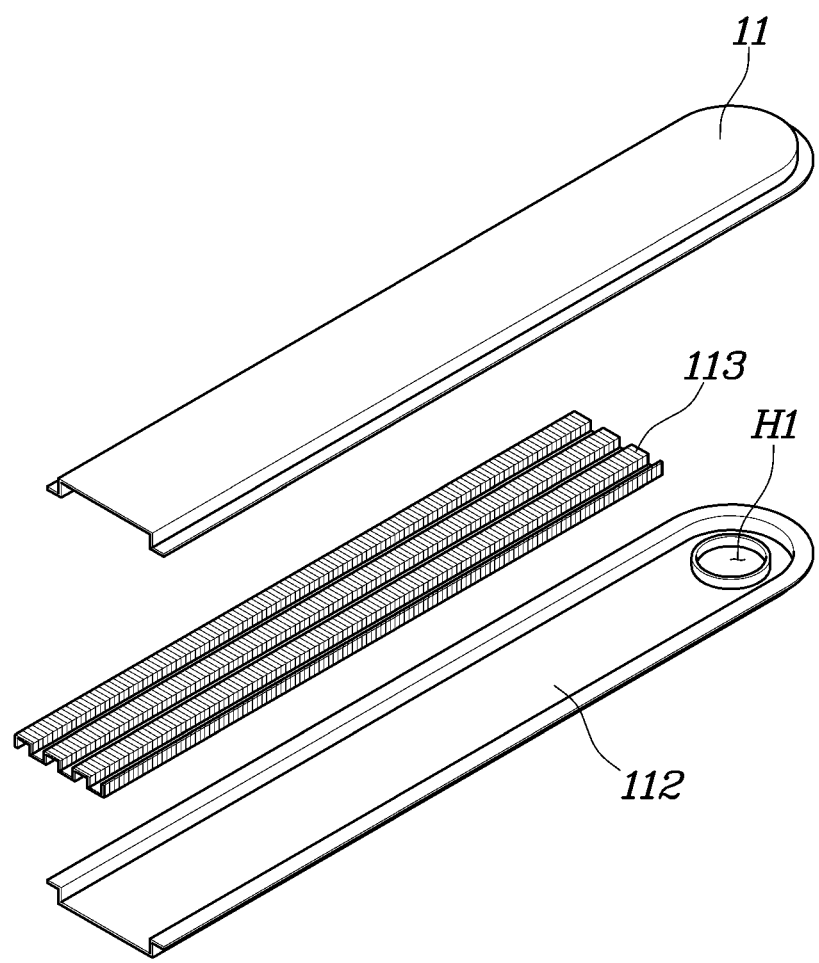
FIG. 5 is an exploded perspective view illustrating a cooling portion of the liquid-cooling type double-sided cooler illustrated in FIG. 1.

FIG. 4 is a cross-sectional view partially taken on the liquid-cooling type double-sided cooler in one form of the present disclosure illustrated in FIG. 1 and FIG. 5 is an exploded perspective view illustrating a cooling portion of the liquid-cooling type double-sided cooler in one form of the present disclosure illustrated in FIG. 1.

Referring to FIGS. 4 and 5, in one form of the present disclosure, the first cooling portion 11 may be configured to include an upper cover 111 and a lower cover 112. Likewise, the second cooling portion 21 may be also configured to include an upper cover 211 and a lower cover 212. The upper covers 111, 211 and the lower covers 112, 212 may be bonded to each other at both ends in a width direction thereof and a cooling liquid path within which cooling liquid flows may be formed therebetween.

For cooling of the cooling object 100 as described above, an outer surface of the lower cover 112 of the first cooling portion 11 may directly contact with an upper surface of the cooling object 100 or contact therewith while interposing a thermal grease; and an outer surface of the upper cover 211 of the second cooling portion 21 may directly contact with a lower surface of the cooling object 100 or contact therewith while interposing a thermal grease.

Further, a cooling liquid path of the first cooling portion 11 and a cooling liquid path of the second cooling portion 21 may be installed with a cooling pin 113, 213. The cooling pin 113, 213 may be positioned to contact with the upper covers 111, 211 and the lower covers 112, 212 of the cooling portions 11, 21 each installed; and heat that is delivered from the lower cover 112 and the upper cover 211 contacting with the cooling object 100 increases the area contacting with cooling liquid, thereby further enhancing cooling efficiency.

Particularly, in one form of the present disclosure, since the cooling pin 113, 213 is interposed as a structure between the upper covers 111, 211 and the lower covers 112, 212, it may be adjusted to be selectively positioned only at a location that the cooling object 100 interposed between the first cooling portion 11 and the second cooling portion 21 face each of the cooling portions 11, 21, that is, at a location contacting therewith.

Accordingly, in a tube structure of cooler with the cooling pin wholly installed in the related art, it is possible to remove occurrence of a pressure loss by a cooling pin and to resolve a temperature deviation of cooling liquid between the flow paths divided by the cooling pin. Accordingly, the liquid-cooling type double-sided cooler in one form of the present disclosure may remarkably enhance cooling efficiency compared to the cooler in the related art.

Meanwhile, one ends of the first cooling portion 11, 12 and the second cooling portion 21, 22 may be formed with a cooling nipple 31, 32 and a header tank 41, 42 so that cooling liquid may be introduced or discharged. For example, cooling liquid may be introduced into the first cooling portion 11, 12 via the cooling nipple 31 and the header tank 41 connected to the one end of the first cooling portion 11, 12 and discharged via the header tank 42 and the cooling nipple 32 connected to the one end of the second cooling portion 21, 22. Of course, flow of cooling liquid may be conversely formed.

Accordingly, so that flow of cooling liquid between the first cooling portion 11, 12 and the second cooling portion 21, 22 may be formed, other ends of the first cooling portion 11, 12 and the second cooling portion 21, 22 may be formed with a coupling structure (A) that the cooling liquid path of the two cooling portions may be communicated with each other.

Figure 6:
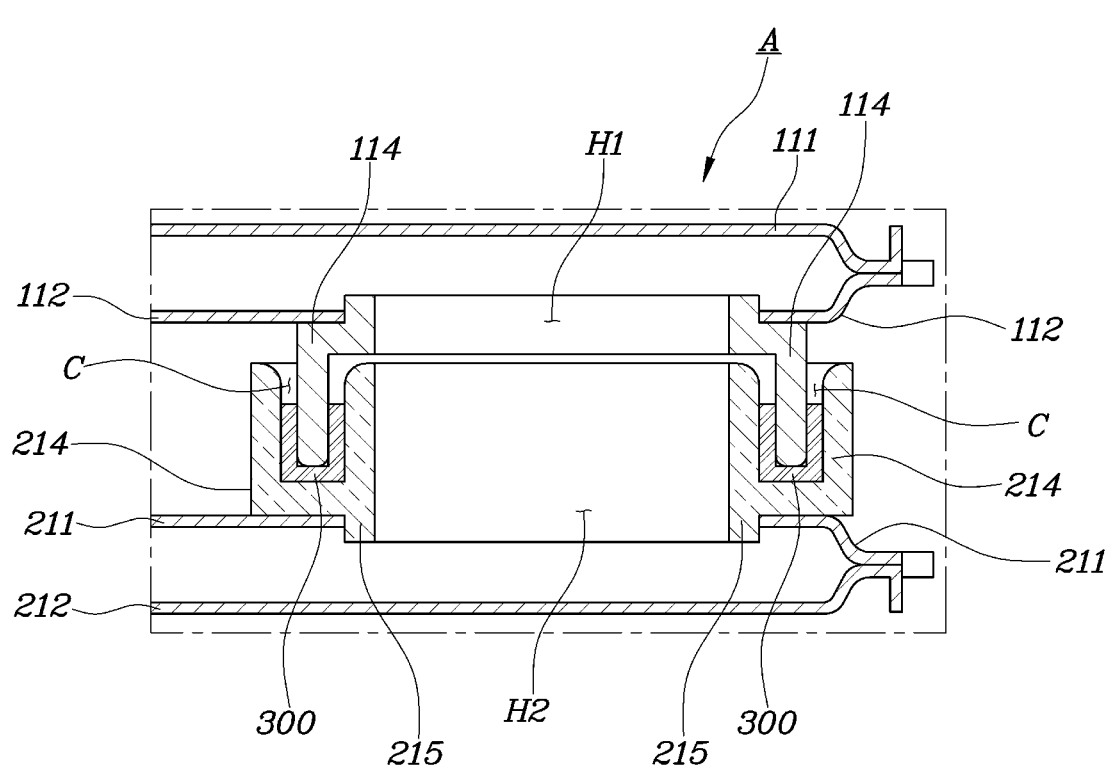
FIG. 6 is a partial cross-sectional view illustrating in detail the coupling structure of the liquid-cooling type double-sided cooler illustrated in FIG. 1.

FIG. 6 is a partial cross-sectional view illustrating in detail the coupling structure of the liquid-cooling type double-sided cooler in one form of the present disclosure illustrated in FIG. 1.

Referring to FIG. 6, the first cooling portion 11 and the second cooling portion 21 may be formed with a communication hole H1, H2 penetrating the cooling liquid path and an outside on other ends, respectively, opposite to the one ends into which cooling liquid is introduced or discharged. That is, the first communication hole H1 may be formed on an end portion of the lower cover 112 of the first cooling portion 11 and the second communication hole H2 may be formed on an end portion of the upper cover 211 of the second cooling portion 21. The first communication hole H1 and the second communication hole H2 may be positioned to face each other and the first cooling portion 11 and the second cooling portion 21 are coupled at the other ends thereof, and thereby the cooling liquid path of the first cooling portion 11 and the cooling liquid path of the second cooling portion 21 may be communicated with each other. Accordingly, flow of cooling liquid between the first cooling portion 11, 12 and the second cooling portion 21, 22, that is, flow of cooling liquid that cooling liquid introduced from the one end of the first cooling portion 11, 12 flows toward the one end of the second cooling portion 21, 22 or in an opposite direction thereof may be formed.

In the case that flow of cooling liquid between the first cooling portion 11, 12 and the second cooling portion 21, 22 through the first communication hole H1 and the second communication hole H2 is formed, a liquid-tight structure according to coupling of the first cooling portion 11, 12 and the second cooling portion 21, 22 has to be formed.

For this purpose, one form of the present disclosure may formed with a first edge portion 114 protruded toward the outside along a circumference of the first communication hole H1 on the first cooling portion 11, 12; and a second edge portion 214, 215 protruded toward the outside along a circumference of the second communication hole H2 on the second cooling portion 21, 22. One of the first edge portion 114 and the second edge portion 214, 215 may be coupled as a structure inserted into the other; and a sealing portion 300 for sealing may be formed around an insertion structure of the first edge portion 114 and the second edge portion 214, 215 to form a stronger liquid-tight structure. Herein, the sealing portion 300 may be formed by depositing a liquid-state sealing member or implemented by a method of assembling an elastic member such as a pre-manufactured rubber and the like.

More preferably, as illustrated in FIG. 6, the second edge portion 214, 215 may be formed as a structure including a first protrusion portion 214 protruded toward the outside along the circumference of the second communication hole H2; and a second protrusion portion 215 protruded toward the outside along the circumference of the first communication hole H1 at a location to be spaced in an opposite direction of the second communication hole H2 apart from the first protrusion portion 214.

Herein, the first edge portion 114 may be inserted into a space (C) between the first protrusion portion 214 and the second protrusion portion 215, and thereby the first edge portion 114 and the second edge portion 214, 215 may be coupled.

In this case, the space (C) between the first protrusion portion 214 and the second protrusion portion 215 may be formed with the sealing portion 300 for sealing; the sealing portion 300 may seal the spaces between the first edge portion 114 and the first protrusion portion 214 and between the first edge portion 114 and the second protrusion portion 215, thereby forming a stronger liquid-tight structure.

Accordingly, one form of the present disclosure may form the separate coupling structure (A) so that the first cooling portion 11, 12 and the second cooling portion 21, 22 of the upper and lower portions are communicated with each other through the communication hole H1, H2 formed with the lower surface and the upper surface thereof, respectively, when comparing with the liquid-cooling type double-sided cooler in the related art that forms the cooling structure of the upper and lower portions through the bending process with respect to the tube-shaped cooling portion, thereby solving the problems such as narrowing of flow path and thereby a pressure loss, blockage of flow path due to impurities and the like that occur in the bending process and also the problem that the cooler is easily broken in the bending process or after the bending process.

In some forms of the present disclosure, the coupling structure of the cooler may be implemented as various other forms other than the form illustrated in FIG. 6.

FIGS. 7 to 12 are partial cross-sectional views illustrating various examples of the coupling structure of the liquid-cooling type double-sided cooler applied to various forms of the present disclosure.

Figure 7:
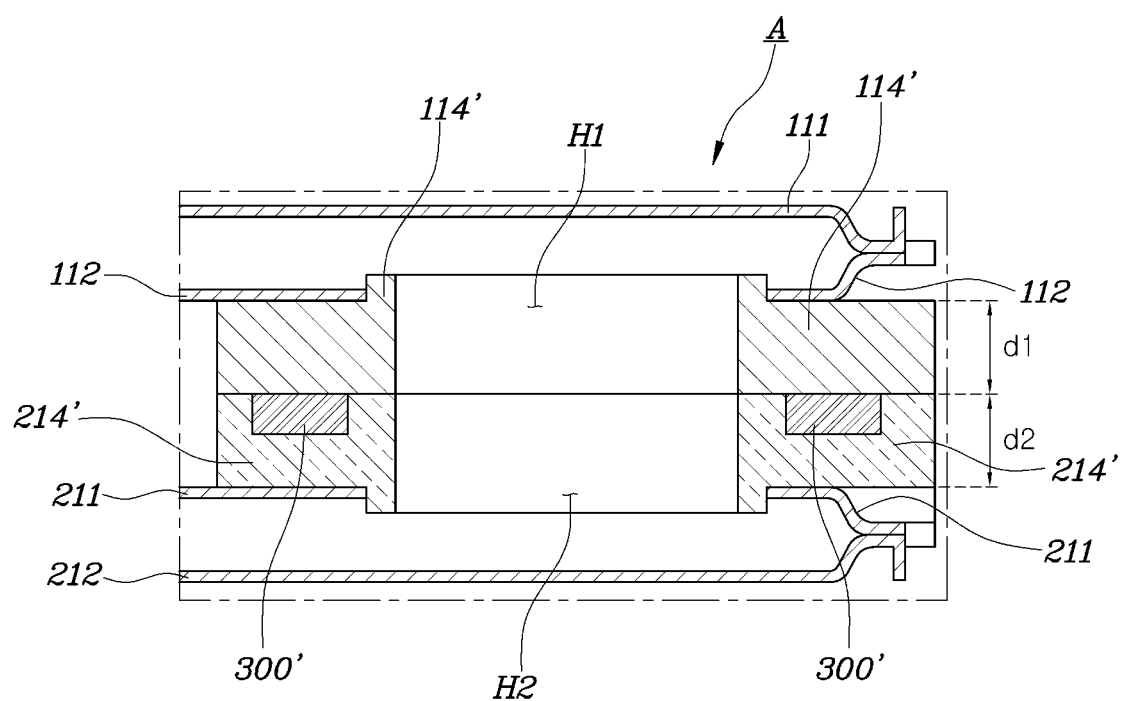
FIGS. 7 to 13 are partial cross-sectional views illustrating various examples of the coupling structure of the liquid-cooling type double-sided cooler.

Firstly, FIG. 7 illustrates the form forming a plate-shaped edge portion 114', 214' having a constant thickness d1, d2 on the first lower cover 112 and the second upper cover 211, respectively. The first edge portion 114' included in the first cooling portion 11 is positioned on a circumference of the first communication hole H1; and the second edge portion 214' included in the second cooling portion 21 is positioned on a circumference of the second communication hole H2.

According to the coupling structure of FIG. 7, in the case that the first cooling portion 11 and the second cooling portion 21 are positioned so that the first communication hole H1 and the second communication hole H2 face, and thereby the first cooling liquid path and the second cooling liquid path are communicated with each other, a lower surface of the first edge portion 114' and an upper surface of the second edge portion 214' may be in surface contact with each other and coupled.

Particularly, in FIG. 7, a groove (g) may be formed on the upper surface of the second edge portion 214' to be spaced apart from the second communication hole H2 along the circumference of the second communication hole H2; and it is possible to form a sealing portion 300' on the groove (g), thereby implementing a liquid-tight structure. As described above, the sealing portion 300' may be implemented by a solid-state elastic member (gasket) such as a liquid-state sealing member or a rubber. In FIG. 7, since there exists no need that the sealing portion has to penetrate into a certain space by the coupling, it may be appropriate that a solid-state gasket is applied.

Figure 8:
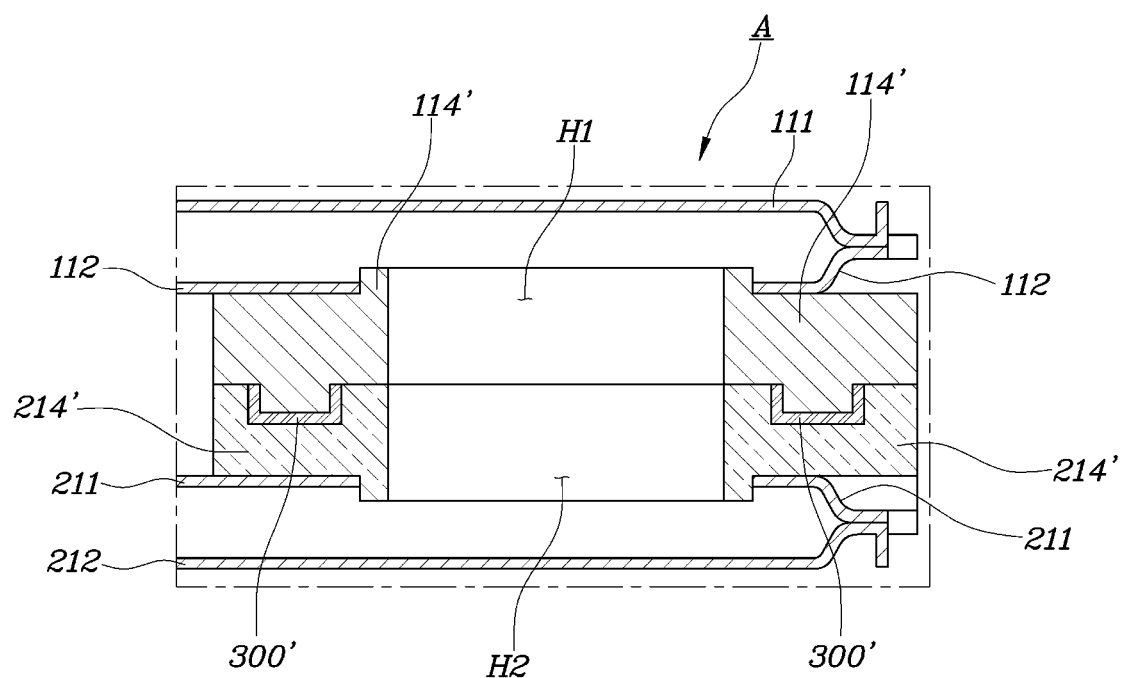

The form illustrated in FIG. 8 is one modified to form a protrusion portion (p) on the lower surface of the first edge portion 114' in the form of FIG. 7. The protrusion portion (p), in the case that the first cooling portion 11 and the second cooling portion 12 are coupled, may be inserted into the groove (g) formed on the upper surface of the second edge portion 214'. In an assembly process forming the coupling structure, a liquid-state sealing member may be beforehand prepared within the groove (g). Accordingly, in the insertion process of the protrusion portion (p), the sealing member may penetrate between surfaces with the protrusion portion (p) and the groove (g) facing each other to form the liquid-tight structure.

Figure 9:
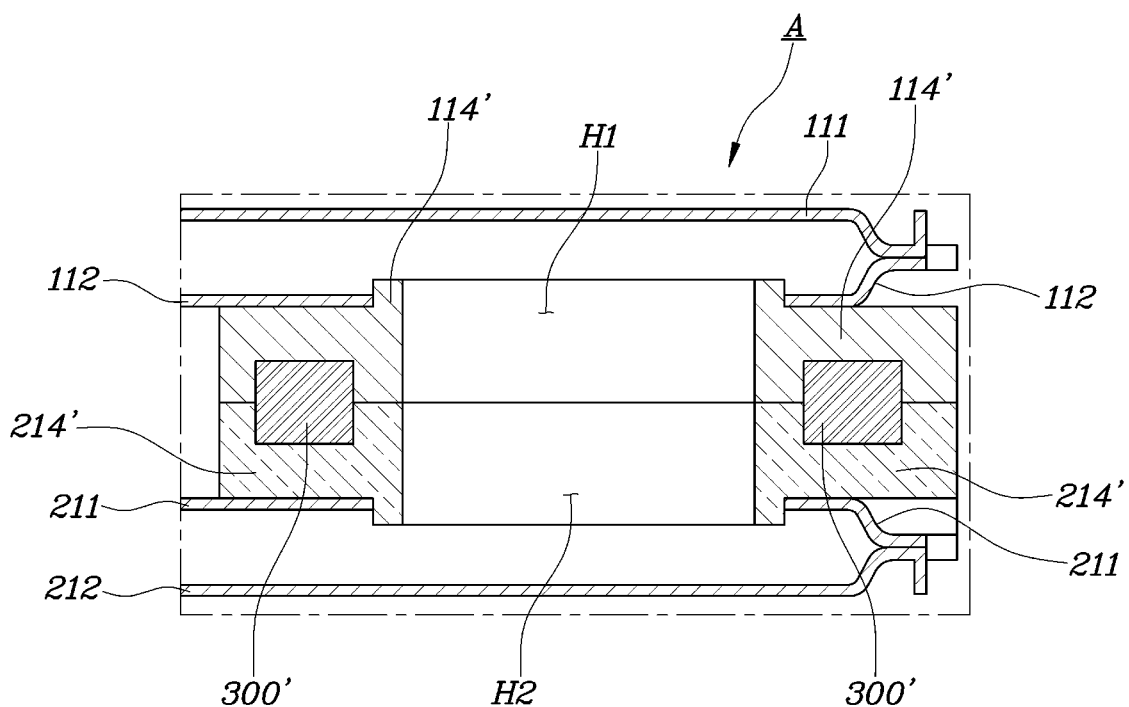

The form illustrated in FIG. 9 represents a modified example forming a first groove (g1) on the lower surface of the first edge portion 114' so as to face a second groove (g2) of the second edge portion 214' in the form of FIG. 7. The form of FIG. 9, in the case that the first edge portion 11 and the second cooling portion 12 are coupled, may position, as a sealing use, a gasket 300' having a size suitable for the space formed by the first groove (g1) and the second groove (g2) to form the liquid-tight structure.

Figure 10:
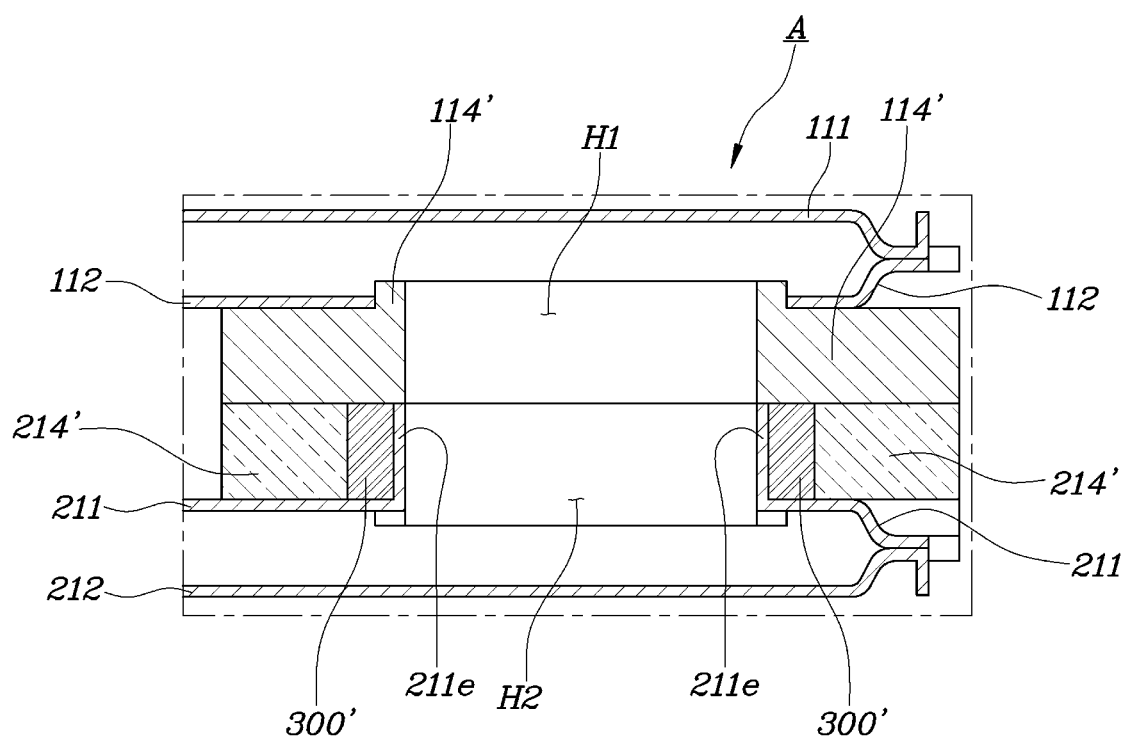

The form illustrated in FIG. 10 represents the form forming a guide portion 211e extensively protruded to surround the second communication hole H2 on the upper cover 211 of the second cooling portion 21. It is possible to position the second edge portion 214' to be spaced at a predetermined interval apart from a circumference of the guide portion 211e and to position the gasket 300' for sealing in the spaces of the guide portion 211e and the second edge portion 214'. The form of FIG. 10, in the case that the first edge portion 11 and the second cooling portion 12 are coupled, makes the lower surface of the first edge portion 114' contact with the upper end of the guide portion 211e and the upper surface of the second edge portion 214'.

Figure 11:
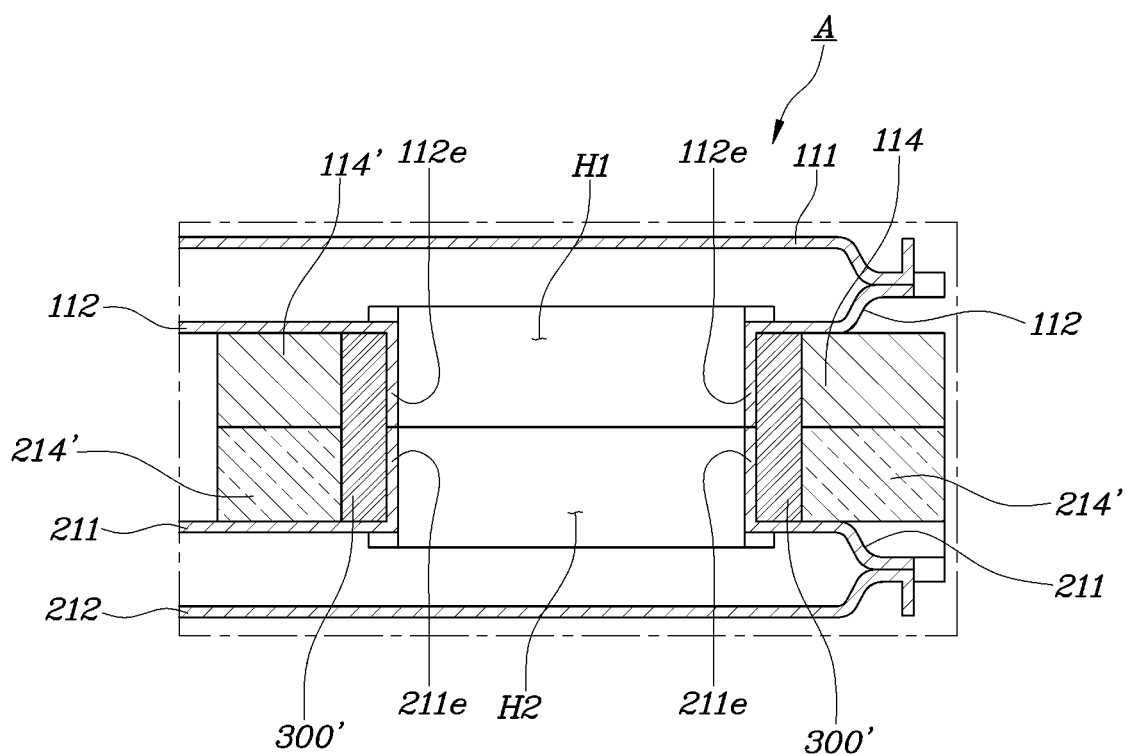

The form illustrated in FIG. 11, such as the guide portion 211e extensively protruded to surround the second communication hole H2 on the upper cover 211 of the second cooling portion 21, represents the form forming the guide portion 112e extensively protruded to surround the first communication hole H1 on the lower cover 112 of the first cooling portion 11. In the form, the first cooling portion 11 may include the first edge portion 114' formed to be spaced at a predetermined interval apart from the circumference of the guide portion 112e. At the status that the first cooling portion 11 and the second cooling portion 21 are coupled, the lower end of the guide portion 112e and the upper end of the guide portion 211e contact with each other; and the first edge portion 114' and the second edge portion 214' are in surface contact with each other. Further, a space between the guide portion 112e and the first edge portion 114' and a space between the guide portion 211e and the second edge portion 214' may face each other to form one space; and it is possible to position, as a sealing use, the gasket 300' having a size suitable for the space to form the liquid-tight structure.

Figure 12:
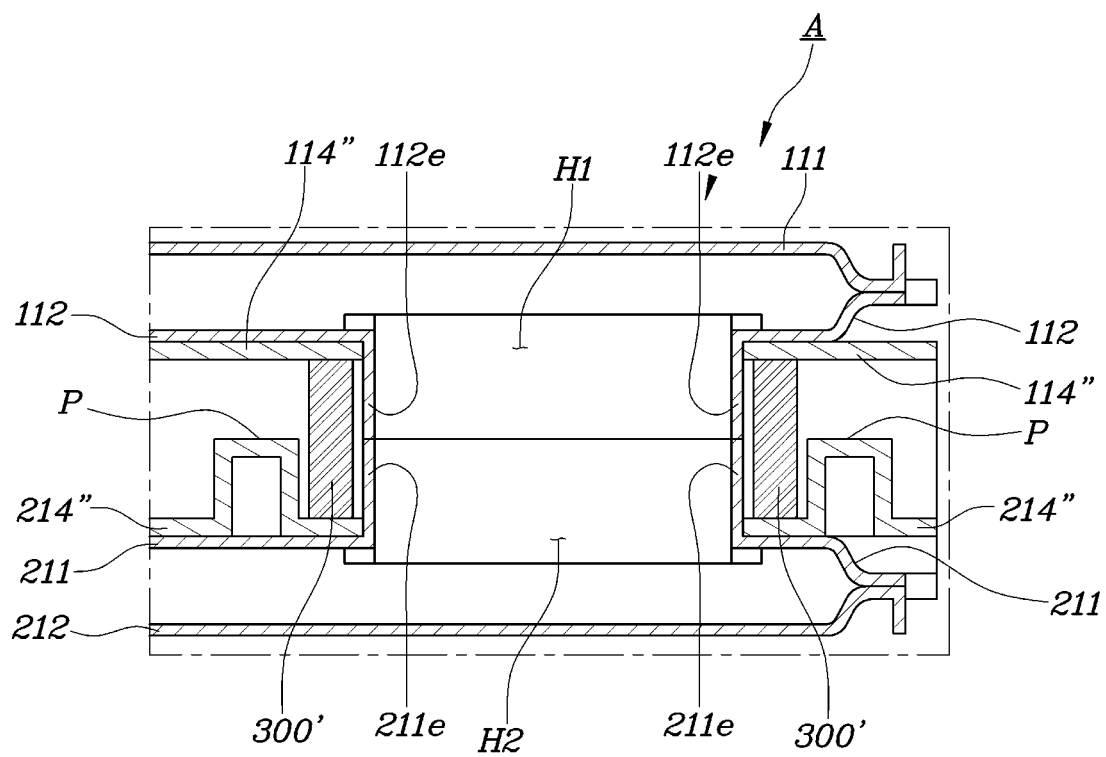

The form illustrated in FIG. 12 represents an example that makes a plate-shaped structure instead of the edge portion having the thickness explained in FIGS. 7 to 11 and forms the coupling structure of the first cooling portion 11 and the second cooling portion 21.

Like the form illustrated in FIG. 11, in the form illustrated in FIG. 12, as illustrated, the lower cover 112 of the first cooling portion 11 may include the guide portion 112e extensively protruded to surround the first communication hole H1; and the upper cover 211 of the second cooling portion 21 may include the guide portion 211e extensively protruded to surround the second communication hole H2.

The first cooling portion 11 may include a protection plate 114" being a plate-shaped structure; and the second cooling portion 21 may also include a protection plate 214" being a plate-shaped structure. The protection plate 114" included in the first cooling portion 11 is positioned around the first communication hole H1 as formation including a penetration hole corresponding to the second communication hole H2 so that the first communication hole H1 is communicated with the outside without other process. The protection plate 214" included in the second cooling portion 21 may include a protrusion portion (p') protruded along the circumference of the second communication hole H2 by a press process and the like.

In the form, at the status that the first cooling portion 11 and the second cooling portion 21 are coupled, the lower end of the guide portion 112e and the upper end of the guide portion 211e contact with each other; and the protrusion portion (p') does not contact with the first cooling portion 11. The form may further include the gasket 300' between the first protection plate 114" and an upper surface of the second protection plate 124" between the protrusion portion (P) and the second guide portion 211e to implement the liquid-tight structure.

Figure 13:
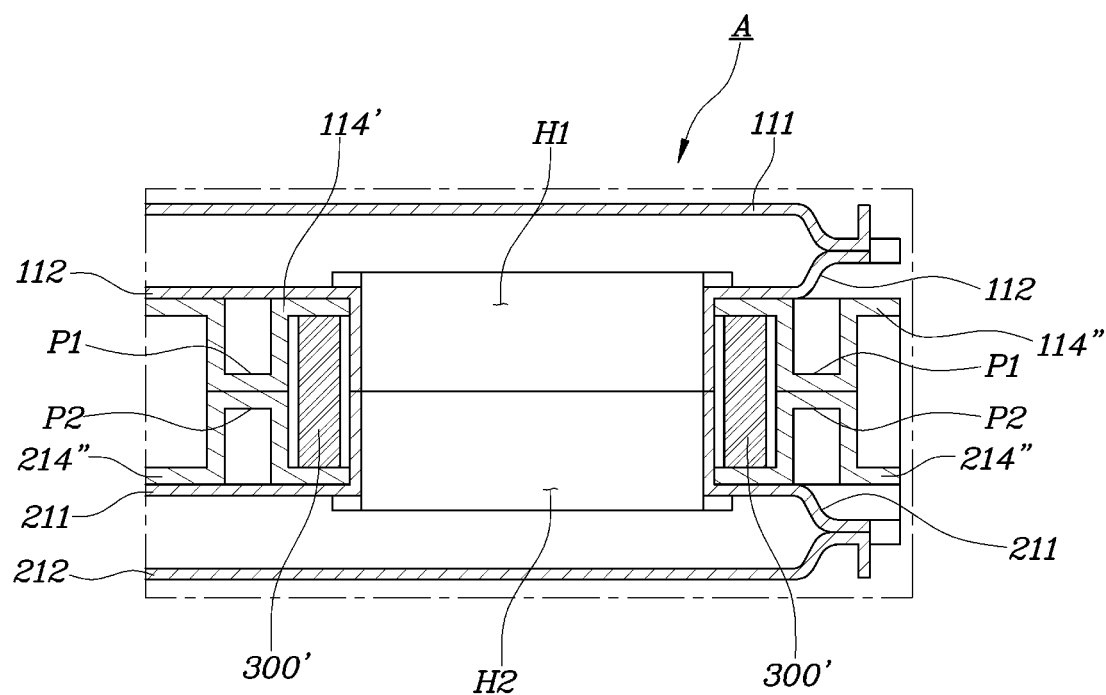

FIG. 13 is characterized by making the protection plate 114" of the first cooling portion 11 and also forming a protrusion portion on the first protection plate 114" in the form illustrated in FIG. 12.

The form illustrated in FIG. 13, at the status that the first cooling portion 11 and the second cooling portion 21 are coupled, makes the lower end of the guide portion 112e and the upper end of the guide portion 211e contact with each other; and also two protrusion portions (P1, P2) contact with each other on the upper and lower ends thereof. Further, in the form, a space between the protrusion portion of the first protection plate 114" and the first guide portion 112e and a space between the protrusion portion of the second protection plate 214" and the second guide portion 211e face each other and are communicated with each other to form one space. The space formed by the two spaces may be formed with the gasket 300' to implement the liquid-tight structure of the double-sided cooler.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A liquid-cooling type double-sided cooler comprising:
   a first cooling portion including:
      a first upper cover coupled to a first lower cover; and
      the first lower cover having a first communication hole that is configured to penetrate the first cooling liquid path and an outside of the first cooling portion on one end portion of the first lower cover, wherein the first upper cover and the first lower cover form a first cooling liquid path between the first upper cover and the first lower cover;
   a second cooling portion including:
      a second lower cover coupled to a second upper cover; and
      the second upper cover having a second communication hole that is configured to penetrate the second cooling liquid path and an outside of the second cooling portion on one end portion of the second upper cover, wherein the second upper cover is provided at a distance from a lower portion of the first cooling portion; and
   a gasket provided between a lower surface of a first protection plate and an upper surface of a second protection plate, wherein the second protection plate is provided between the protrusion portion and the second guide portion,
   wherein the first cooling portion and the second cooling portion are positioned such that:
      the first communication hole and the second communication hole face each other; and the first cooling liquid path and the second cooling liquid path are connected with each other, wherein the first lower cover further comprises a first guide portion that extends along the circumference of the first communication hole and protrudes toward a lower portion of the first lower cover, and the second upper cover further comprises a second guide portion that extends along the circumference of the second communication hole and protrudes toward an upper portion of the first lower cover, wherein the first cooling portion comprises the first protection plate that is attached to the first lower cover and is provided on the circumference of the first communication hole, wherein the second cooling portion comprises the second protection plate that is attached to the second upper cover and is provided on the circumference of the second communication hole, wherein the second protection plate comprises a protrusion portion that protrudes toward an upper portion of the second cooling portion along the circumference of the second communication hole located at a distance from the second communication hole, and wherein a lower end of the first guide portion and an upper end of the second guide portion are coupled to each other such that the first cooling liquid path and the second cooling liquid path are connected with each other.

2. The liquid-cooling type double-sided cooler of claim 1, wherein the first cooling portion comprises a first edge portion that is attached to the first lower cover and protrudes toward a lower portion of the first communication hole along a circumference of the first communication hole, wherein the second cooling portion comprises a second edge portion that is attached to the second upper cover and protrudes toward an upper portion of the second communication hole along a circumference of the second communication hole, and wherein the first edge portion and the second edge portion are coupled to each other such that the first cooling liquid path and the second cooling liquid path are connected with each other.

3. The liquid-cooling type double-sided cooler of claim 2, wherein the liquid-cooling type double-sided cooler further comprises:

a sealing portion configured to seal a space between the first edge portion and the second edge portion, wherein the sealing portion is provided between the first edge portion and the second edge portion.

4. The liquid-cooling type double-sided cooler of claim 2, wherein the second edge portion comprises:

a first protrusion portion protruding toward an outside of the second communication hole along the circumference of the second communication hole; and a second protrusion portion protruding toward an outside of the first protrusion portion along a circumference of the first protrusion portion, wherein the second protrusion portion is provided in an opposite direction of the second communication hole from the first protrusion portion, and wherein the first edge portion is inserted into a space between the first protrusion portion and the second protrusion portion such that the first edge portion and the second edge portion are coupled to each other.

5. The liquid-cooling type double-sided cooler of claim 4, wherein the liquid-cooling type double-sided cooler further comprises:

a sealing portion configured to seal a space between the first protrusion portion and the second protrusion portion, wherein the sealing portion is formed in the space between the first protrusion portion and the second protrusion portion.

6. The liquid-cooling type double-sided cooler of claim 1, wherein the first cooling portion comprises a first edge portion attached to the first lower cover, wherein the first edge portion has a predetermined thickness on the circumference of the first communication hole, wherein the second cooling portion comprises a second edge portion attached to the second upper cover, wherein the second edge portion has a predetermined thickness on the circumference of the second communication hole, and wherein a lower surface of the first edge portion is in contact with an upper surface of the second edge portion such that the first cooling liquid path and the second cooling liquid path are connected with each other.

7. The liquid-cooling type double-sided cooler of claim 6, wherein the upper surface of the second edge portion comprises:

a groove formed along the circumference of the second communication hole; and a sealing portion filled in the groove.

8. The liquid-cooling type double-sided cooler of claim 6, wherein the first edge portion comprises a protrusion portion that protrudes along the circumference of the first communication hole on a lower surface of the first edge portion, wherein the second edge portion comprises a groove that is formed along the circumference of the second communication hole on an upper surface of the second edge portion, and wherein when the lower surface of the first edge portion and the upper surface of the second edge portion are in contact with each other, the protrusion portion is inserted into the groove.

9. The liquid-cooling type double-sided cooler of claim 8, wherein the liquid-cooling type double-sided cooler further comprises:

a sealing portion configured to seal a space between the protrusion portion and the groove.

10. The liquid-cooling type double-sided cooler of claim 6, wherein the liquid-cooling type double-sided cooler further comprises:

a sealing portion configured to fill in a space formed by the first groove and the second groove when the lower surface of the first cooling portion and the upper surface of the second cooling portion are in contact with each other, wherein the first edge portion comprises a first groove that is formed along the circumference of the first communication hole on a lower surface of the first edge portion, and wherein the second edge portion comprises a second groove that is formed along the circumference of the second communication hole on an upper surface of the second edge portion and that is configured to face the first groove.

11. The liquid-cooling type double-sided cooler of claim 6, wherein the liquid-cooling type double-sided cooler further comprises:

a sealing portion configured to fill in a space between the guide portion and the second edge portion, wherein the second upper cover further comprises a guide portion that extends along the circumference of the second communication hole and protrudes toward an upper portion of the second upper cover, wherein the second edge portion is provided at a predetermined distance from the guide portion, and wherein an upper end of the guide portion and the upper surface of the second edge portion are in contact with the lower surface of the first edge portion.

12. The liquid-cooling type double-sided cooler of claim 6, wherein the liquid-cooling type double-sided cooler further comprises:

a sealing portion configured to fill in a space that is formed by a first space and a second space, wherein the first lower cover further comprises a first guide portion that extends along the circumference of the first communication hole and protrudes toward a lower portion of the first lower cover, and the second upper cover further comprises a second guide portion that extends along the circumference of the second communication hole and protrudes toward an upper portion of the first lower cover, wherein the first edge portion is provided at a predetermined distance from the first guide portion, and the second edge portion is provided at a predetermined distance from the second guide portion, wherein a lower end of the first guide portion and an upper end of the second guide portion are in contact with each other, and wherein the first space and the second space face each other, wherein the first space is a space between the first edge portion and the first guide portion and the second space is a space between the second edge portion and the second guide portion.

13. The liquid-cooling type double-sided cooler of claim 1, wherein the first protection plate comprises a protrusion portion that protrudes toward a lower portion of the first protection plate along the circumference of the first communication hole located at a distance from the first communication hole, wherein a lower end of the protrusion portion of the first protection plate and an upper end of the protrusion portion of the second protection plate are in contact with each other, and wherein the gasket is provided in a space formed by a third space and a fourth space, wherein the third space is a space between the protrusion portion of the first protection plate and the first guide portion and the fourth space is a space between the protrusion portion of the second protection plate and the second guide portion.

* * * * *